United States Patent
Johnson

(10) Patent No.: US 8,019,913 B2
(45) Date of Patent: *Sep. 13, 2011

(54) DYNAMICALLY SETTING BURST LENGTH OF DOUBLE DATA RATE MEMORY DEVICE BY APPLYING SIGNAL TO AT LEAST ONE EXTERNAL PIN DURING A READ OR WRITE TRANSACTION

(75) Inventor: Christopher S. Johnson, Meridian, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 32 days.

This patent is subject to a terminal disclaimer.

(21) Appl. No.: 12/503,097

(22) Filed: Jul. 15, 2009

(65) Prior Publication Data

US 2009/0276548 A1 Nov. 5, 2009

Related U.S. Application Data

(60) Continuation of application No. 11/296,359, filed on Dec. 8, 2005, now Pat. No. 7,603,493, which is a division of application No. 10/191,290, filed on Jul. 10, 2002, now Pat. No. 7,149,824.

(51) Int. Cl.
*G06F 13/26* (2006.01)
*G06F 12/06* (2006.01)
*G06F 8/00* (2006.01)
*G06F 7/00* (2006.01)

(52) U.S. Cl. ............ 710/35; 710/2; 710/5; 710/14; 710/33; 711/104; 711/105; 711/106; 711/127; 711/165; 711/170; 711/212; 364/189.05; 364/201; 364/203; 364/203.06; 364/204; 364/233; 364/236

(58) Field of Classification Search ............ 710/35, 710/2, 5, 14, 33; 711/104–106, 212; 365/189.05, 365/201, 203, 203.6, 204, 233, 236
See application file for complete search history.

(56) References Cited

U.S. PATENT DOCUMENTS

| | | | |
|---|---|---|---|
| 4,315,308 A | 2/1982 | Jackson | |
| 4,394,753 A | 7/1983 | Penzel | |
| 4,480,307 A | 10/1984 | Budde et al. | |
| 4,481,572 A | 11/1984 | Ochsner | |
| 4,623,986 A | 11/1986 | Chauvel | |
| 4,663,735 A | 5/1987 | Novak et al. | |

(Continued)

FOREIGN PATENT DOCUMENTS

JP 60-80193 5/1985

(Continued)

OTHER PUBLICATIONS

Davis, Brian and Jacob, Bruce, DDR2 and Low Latency Variants, Electrical Engineering & Computer Science University of Michigan, Electrical & Computer Engineering University of Maryland, No Date, pp. 1-15.*

(Continued)

*Primary Examiner* — Tammara Peyton
(74) *Attorney, Agent, or Firm* — Lerner, David, Littenberg, Krumholz & Mentlik, LLP

(57) ABSTRACT

One or more external control pins and/or addressing pins on a memory device are used to set one or both of a burst length and burst type of the memory device.

20 Claims, 7 Drawing Sheets

U.S. PATENT DOCUMENTS

| | | | |
|---|---|---|---|
| 4,675,850 | A | 6/1987 | Kumanoya et al. |
| 4,734,909 | A | 3/1988 | Bennett et al. |
| 4,755,937 | A | 7/1988 | Glier |
| 4,757,473 | A | 7/1988 | Kurihara et al. |
| 4,763,249 | A | 8/1988 | Bomba et al. |
| 4,785,394 | A | 11/1988 | Fischer |
| 4,785,428 | A | 11/1988 | Bajwa et al. |
| 4,845,664 | A | 7/1989 | Aichelmann, Jr. et al. |
| 4,870,622 | A | 9/1989 | Aria et al. |
| 4,876,670 | A | 10/1989 | Nakabayashi et al. |
| 5,022,004 | A | 6/1991 | Kurtze et al. |
| 5,134,699 | A | 7/1992 | Aria et al. |
| 5,142,637 | A | 8/1992 | Harlin et al. |
| 5,179,687 | A | 1/1993 | Hidaka et al. |
| 5,218,686 | A | 6/1993 | Thayer |
| 5,590,086 | A | 12/1996 | Park et al. |
| 5,598,376 | A | 1/1997 | Merritt et al. |
| 5,606,717 | A | 2/1997 | Farmwald et al. |
| 5,717,639 | A | 2/1998 | Williams et al. |
| 5,737,587 | A | 4/1998 | Leung et al. |
| 5,896,404 | A | 4/1999 | Kellogg et al. |
| 5,918,072 | A | 6/1999 | Bhattacharya |
| 5,946,269 | A | 8/1999 | Jang .............. 365/236 |
| 6,088,760 | A | 7/2000 | Walker et al. |
| 6,130,853 | A * | 10/2000 | Wang et al. .............. 365/230.06 |
| 6,272,577 | B1 | 8/2001 | Leung et al. |
| 6,324,116 | B1 | 11/2001 | Noh et al. |
| 6,327,175 | B1 | 12/2001 | Manapat et al. |
| 6,339,817 | B1 | 1/2002 | Maesako et al. |
| 6,356,504 | B1 * | 3/2002 | Kim .............. 365/230.06 |
| 6,414,890 | B2 | 7/2002 | Arimoto et al. |
| 6,414,894 | B2 | 7/2002 | Ooishi et al. .............. 365/222 |
| 6,415,374 | B1 * | 7/2002 | Faue et al. .............. 711/173 |
| 6,483,772 | B2 | 11/2002 | Ozawa et al. |
| 6,493,789 | B2 | 12/2002 | Ware et al. |
| 6,580,659 | B1 | 6/2003 | Roohparvar .............. 365/233 |
| 6,640,266 | B2 | 10/2003 | Arcoleo et al. |
| 6,651,134 | B1 | 11/2003 | Phelan |
| 6,665,222 | B2 | 12/2003 | Wright et al. |
| 6,724,686 | B2 * | 4/2004 | Ooishi et al. .............. 365/233.14 |
| 6,823,485 | B1 | 11/2004 | Muranaka .............. 714/719 |
| 6,912,628 | B2 * | 6/2005 | Wicki et al. .............. 711/156 |
| 7,603,534 | B2 * | 10/2009 | Roohparvar .............. 711/168 |
| 2003/0135702 | A1 | 7/2003 | Hongo et al. .............. 711/159 |

FOREIGN PATENT DOCUMENTS

| | | |
|---|---|---|
| JP | 62-51387 | 3/1987 |
| JP | 63-142445 | 6/1988 |
| JP | 63-239676 | 10/1988 |
| WO | WO 89/06013 | 6/1989 |

OTHER PUBLICATIONS

Graham, A. et al., "Pipelined static RAM endows cache memories with 1-ns. speed", Electronic Design, Dec. 27, 1984, pp. 157-171.
"iAPX 43201 iAPX 43202 VLSI General Data Processor", Intel.
"iAPX 43203 VLSI Interface Processor", Intel.
"Configurations for Solid State Memories", JEDEC Solid State Technology Association, JEDEC Standard No. 21-C, Release 9, Aug. 1999.
"Electrical Specifications for iAPX 43204 Bus-Interface Unit (BIU) and iAPX 43205 Memory Control Unit (MCU)", Intel, Mar. 1983.
"iAPX 43204 iAPX 43205 Fault Tolerant Bus Interface and Memory Control Units", Intel, Mar. 1983.
"iApx 432 Interconnect Architecture Reference Manual", Intel.
Lodi, R.J. et al., "Chip and System Characteristics of a 2048-Bit MNOS-Boram LSI Circuit", IEEE International Solid State Circuits Conference, Feb. 1976.
Lodi, R.J. et al., "MNOS-BORAM Memory Characteristics", IEEE Journal of Solid-State Circuits, Vo. SC-11, No. 5, Oct. 1976.
"Synchronous Dram", Micron Semiconductor, Inc., 1994.
Thorson, M., "ECL Bus Controller Hits 266 Mbytes/s; MIPS R6020 Handles CPU, RAMm, I/O Interface", Microprocessor Report, Jan. 24, 1990, pp. 12-14, 1-2.
"IEEE Standard for a Simple 32-Bit Backplane Bus: NuBus", Technical Committee on Microcomputers and Microprocessors of the IEEE Computer Society, 1988.
Rau, B.R. et al., "The Cydra 5 Departmental Supercomputer; Design Philosophies, Decisions, and Trade-offs", IEEE, 1989, pp. 12-29.
Gustavson, D.B. et al., "The Scalable Coherent Interface Project (SuperBus)", Scalable Coherent Interface, Aug. 22, 1988.
Schanke, M., "Proposal for Clock Distribution in Sci.", Dolphin Sever Technology, May 5, 1989.
Gustavson, D.B., "Scalable Coherent Interface", COMPCON, 1989.
Gustavson, D.B., "The Scalable Coherent Interface, IEEE P1596, Status and Possible Applications to Data Acquisition and Physics", IEEE Nuclear Science Symposium, Jan. 1990.
Aines, K., "SCI: A Proposal for SCI Operation", Norsk Data A/S, Oslo, Norway, Nov. 10, 1988.
Aines, K., "SCI: A Proposal for SCI Operation", Norsk Data A/S, Oslow, Norway, Jan. 6, 1989.
Kristiansen, E. et al., "Scalable Coherent Interface", Eurobus Conference Proceedings, Munich, May 9-10, 1989.
"Draft Standard for a High-Speed Memory Interface (SyncLink)", Microprocessor and Microcomputer Standards Subcommittee of the IEEE Computer Society, 1996.
Kristiansen, E. et al., "Scalable Coherent Interface", Eurobus, London, Sep. 1989.
C-DRAM Advantages.
Watanabe, S. et al., "An Experimental 16-Mbit CMOS DRAM Chip with a 100-MHz Serial Read/Write Mode", IEEE Journal of Solid-State Circuits, vol. 24, No. 3, Jun. 1982, pp. 763-770.
Exh. 14., Morgan, K. "The CVAX CMCTL—A CMOS Memory Controller Chip", Digital Technical Journal, No. 7, Aug. 1988, pp. 139-143.
Chelsey.
Micron Technology Inc. data sheet: "128Mb: ×4,×8,×16 Sdram"; © 1999, Micron technology, Inc., pp. 1-55.

* cited by examiner

| x4 | x8 | x16 | | | | x16 | x8 | x4 |
|---|---|---|---|---|---|---|---|---|
| VDD | VDD | VDD | 1 • | | 66 | Vss | Vss | Vss |
| NC | DQ0 | DQ0 | 2 | | 65 | DQ15 | DQ7 | NC |
| VDDQ | VDDQ | VDDQ | 3 | | 64 | VssQ | VssQ | VssQ |
| NC | NC | DQ1 | 4 | | 63 | DQ14 | NC | NC |
| DQ0 | DQ1 | DQ2 | 5 | | 62 | DQ13 | DQ6 | DQ3 |
| VssQ | VssQ | VssQ | 6 | | 61 | VDDQ | VDDQ | VDDQ |
| NC | NC | DQ3 | 7 | | 60 | DQ12 | NC | NC |
| NC | DQ2 | DQ4 | 8 | | 59 | DQ11 | DQ5 | NC |
| VDDQ | VDDQ | VDDQ | 9 | | 58 | VssQ | VssQ | VssQ |
| NC | NC | DQ5 | 10 | | 57 | DQ10 | NC | NC |
| DQ1 | DQ3 | DQ6 | 11 | | 56 | DQ9 | DQ4 | DQ2 |
| VssQ | VssQ | VssQ | 12 | | 55 | VDDQ | VDDQ | VDDQ |
| NC | NC | DQ7 | 13 | | 54 | DQ8 | NC | NC |
| NC | NC | NC | 14 | | 53 | NC | NC | NC |
| VDDQ | VDDQ | VDDQ | 15 | | 52 | VssQ | VssQ | VssQ |
| NC | NC | LDQS | 16 | | 51 | UDQS | DQS | DQS |
| NC | NC | NC | 17 | | 50 | DNU | DNU | DNU |
| VDD | VDD | VDD | 18 | | 49 | VREF | VREF | VREF |
| NC | DNU | DNU | 19 | | 48 | Vss | Vss | Vss |
| NC | NC | LDM | 20 | | 47 | UDM | DM | DM |
| WE# | WE# | WE# | 21 | | 46 | CK# | CK# | CK# |
| CAS# | CAS# | CAS# | 22 | | 45 | CK | CK | CK |
| RAS# | RAS# | RAS# | 23 | | 44 | CKE | CKE | CKE |
| CS# | CS# | CS# | 24 | | 43 | NC | NC | NC |
| NC | NC | NC | 25 | | 42 | A12 | A12 | A12 |
| BA0 | BA0 | BA0 | 26 | | 41 | A11 | A11 | A11 |
| BA1 | BA1 | BA1 | 27 | | 40 | A9 | A9 | A9 |
| A10/AP | A10/AP | A10/AP | 28 | | 39 | A8 | A8 | A8 |
| A0 | A0 | A0 | 29 | | 38 | A7 | A7 | A7 |
| A1 | A1 | A1 | 30 | | 37 | A6 | A6 | A6 |
| A2 | A2 | A2 | 31 | | 36 | A5 | A5 | A5 |
| A3 | A3 | A3 | 32 | | 35 | A4 | A4 | A4 |
| VDD | VDD | VDD | 33 | | 34 | Vss | Vss | Vss |

| FIG. 3A | FIG. 3B |

| FIG. 3A | FIG. 3B |

…

DYNAMICALLY SETTING BURST LENGTH OF DOUBLE DATA RATE MEMORY DEVICE BY APPLYING SIGNAL TO AT LEAST ONE EXTERNAL PIN DURING A READ OR WRITE TRANSACTION

CROSS-REFERENCE TO RELATED APPLICATIONS

This application is a continuation of U.S. patent application Ser. No. 11/296,359, filed Dec. 8, 2005 now U.S. Pat. No. 7,603,493, which is a divisional of U.S. application Ser. No. 10/191,290, filed Jul. 10, 2002, now U.S. Pat. No. 7,149,824, the entirety of both being incorporated herein by reference.

FIELD OF THE INVENTION

The present invention relates to a method and apparatus which permits modification of the burst length of data in a memory device.

BACKGROUND OF THE INVENTION

A burst mode is known to be used in some memory devices to increase the speed of reading and writing data from and to the memory. Burst mode operation allows reads or writes from or to consecutive memory core locations at high speeds. When a burst mode is not implemented, a memory storage device uses one clock cycle to activate a row, giving the row address, and another clock cycle for column addressing. The READ or WRITE command is given with the column address on separate command lines.

In the clock cycle(s) following the addressing/command cycles, data is transferred from or to a memory device. For example, 4 eight bit data bytes being read from or written to a DDR SDRAM requires one clock cycle to decode a each of the four column addresses. The first column address is issued with the READ or WRITE command with the subsequent column address being decoded internally on the DRAM device freeing up the command bus for other uses.

In addition, by eliminating column decoding time, the command bus is free to reduce latency during back intervening. Accordingly, a burst mode operation provides relatively high data transfer rates and significantly reduces the latency involved in a memory transfer.

The burst mode is generally controlled by setting one or more bits in a mode register provided within a memory device. As shown in FIG. 1, which depicts one exemplary memory device mode register, data within the mode register 100 controls a variety of different chip functions. Bits 13 and 14 of mode register 100 are used to select between a base mode register and an extended mode register; bits 7 through 12 of mode register 100 determine the operating mode of the memory device; bits 4-6 of mode register 100 determine the column address strobe ("CAS") latency; bit 3 of mode register 100 determines whether the burst type is sequential or interleaved; and, bits 0-2 of mode register 100 determine the burst length.

The burst length determines the maximum number of consecutive column locations that can be accessed for a given READ or WRITE command without the need to use clock cycles to transfer subsequent intervening column addresses. As shown in tables 110 and 120, burst lengths of 2, 4 or 8 bytes can be selected for each of the sequential and interleaved burst types which is set by bit position 3.

Mode register 100 is programmed by a CPU or memory controller using a MODE REGISTER SET command and retains the set information until it is programmed again, or the memory device loses power. The mode register must be programmed while all memory cores are idle and no data bursts are in progress, and the memory controller or CPU must wait a specified time before initiating a memory access operation subsequent to programming.

A memory device which allows dynamic programming of burst length would be desirable and would permit faster adjustment of the burst length.

SUMMARY OF THE INVENTION

The present invention mitigates the problems associated with current DRAM devices and provides a unique method and system of allowing a user to dynamically define burst length.

In accordance with an exemplary embodiment of the present invention, control pins provided on a memory storage device are used to set burst length. In addition, a control pin on the memory storage device can be used to determine the burst type. Using control pins to set burst length and type allows the burst length to be set while the memory cores are in use and without waiting after changing the burst length and/or type before initiating a memory access operation.

In another exemplary embodiment of the present invention, the address pins that are not used during column addressing are used for setting the burst length and/or burst type. This embodiment also allows the burst length and/or burst type to be set while the memory cores are in use and without waiting after changing the burst length and/or type before initiating a memory access operation. The burst length does not necessarily have to be set on active commands, READs or WRITEs.

BRIEF DESCRIPTION OF THE DRAWINGS

The above and other features and advantages of the invention will be more readily understood from the following detailed description of the invention which is provided in connection with the accompanying drawings.

FIG. 2 is an illustration of the layout of control pins in a preferred embodiment of the present invention;

DETAILED DESCRIPTION OF PREFERRED EMBODIMENTS

Figure 1:
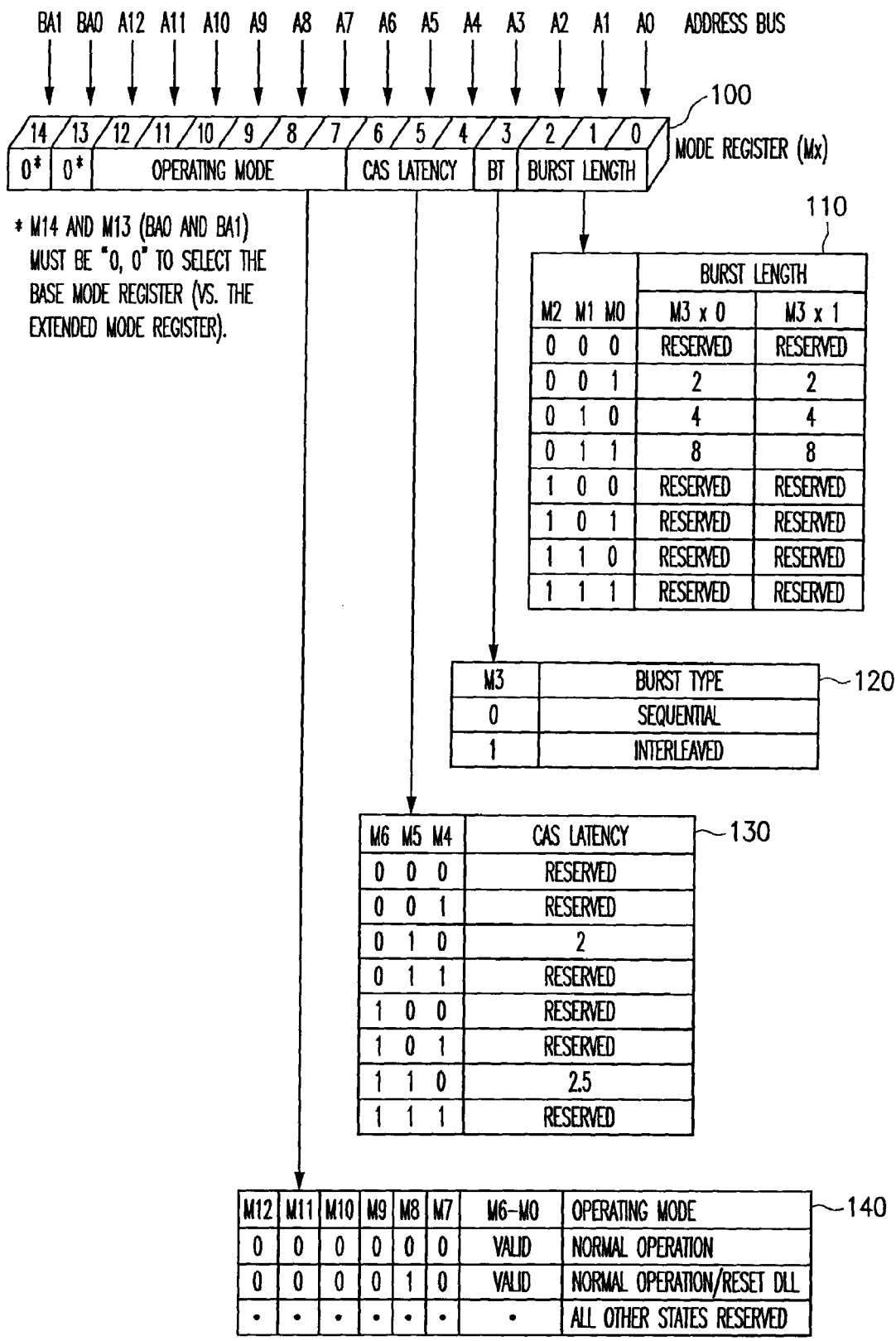
FIG. 1 is an illustration of a conventional memory device mode register and its contents.

In the following detailed description, reference is made to the accompanying drawings which form a part hereof, and in which is shown by way of illustration specific embodiments in which the invention may be practiced. These embodiments are described in sufficient detail to enable those skilled in the art to make and use the invention, and it is to be understood that structural changes may be made and equivalent structures substituted for those shown without departing from the spirit and scope of the present invention.

In accordance with an exemplary embodiment of the present invention, external pins provided on a memory storage device are used to dynamically set the burst length or hard set the burst length. An exemplary memory device 200 which may employ the invention is shown in FIG. 2, and is a 256 Mb double data rate synchronous DRAM (DDR SDRAM). As can be seen, memory device 200 has a plurality of control pins (for example, pins 21, 22, 23, 24 are control pins). While the following description of a preferred embodiment of the present invention is described with reference to a 256 Mb DDR SDRAM, the present invention can be implemented with any memory storage device having external pins.

Memory storage device 200 can be configured to use a single external pin to toggle between two possible burst lengths or a plurality of external pins if a larger number of burst lengths is desired. In most memory chip designs, there are many external pins that are not connected ("NC") and can be turned into control pins. As a result, the present invention can be easily incorporated into most chip designs. One or more of the NC pins can be used as burst length toggle pins. For example, if two possible burst lengths are desired, pin 17 of memory storage device 200, which is labeled NC in FIG. 2, can be used. If the two possible burst lengths are 4 bytes and 8 bytes, then when pin 17 is high, the burst length is e.g. 4 bytes; when pin 17 is low, the burst length is e.g. 8 bytes, or vice versa. If a burst length of 2 bytes is also desirable, NC pin 25 can also be used as up to four burst lengths can be programmed with two control pins. Although the description discusses several different burst lengths, the number of dynamically defined burst lengths is determined based on the number of available external pins.

Figures 3, 3A:
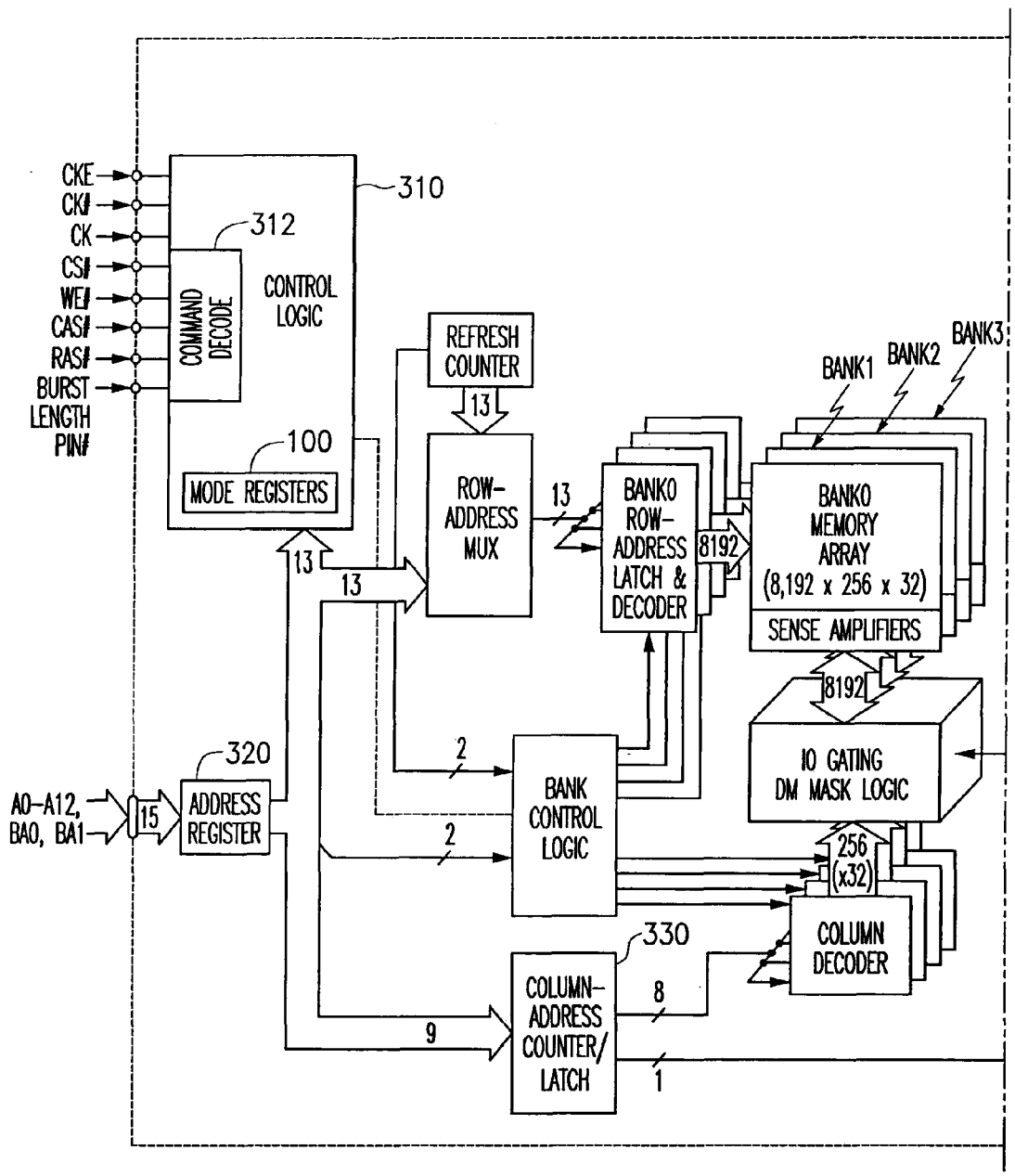
FIG. 3 is an illustration of a block diagram of a 256M×16 DDR SDRAM implementing the present invention.
Figures 3, 3B:
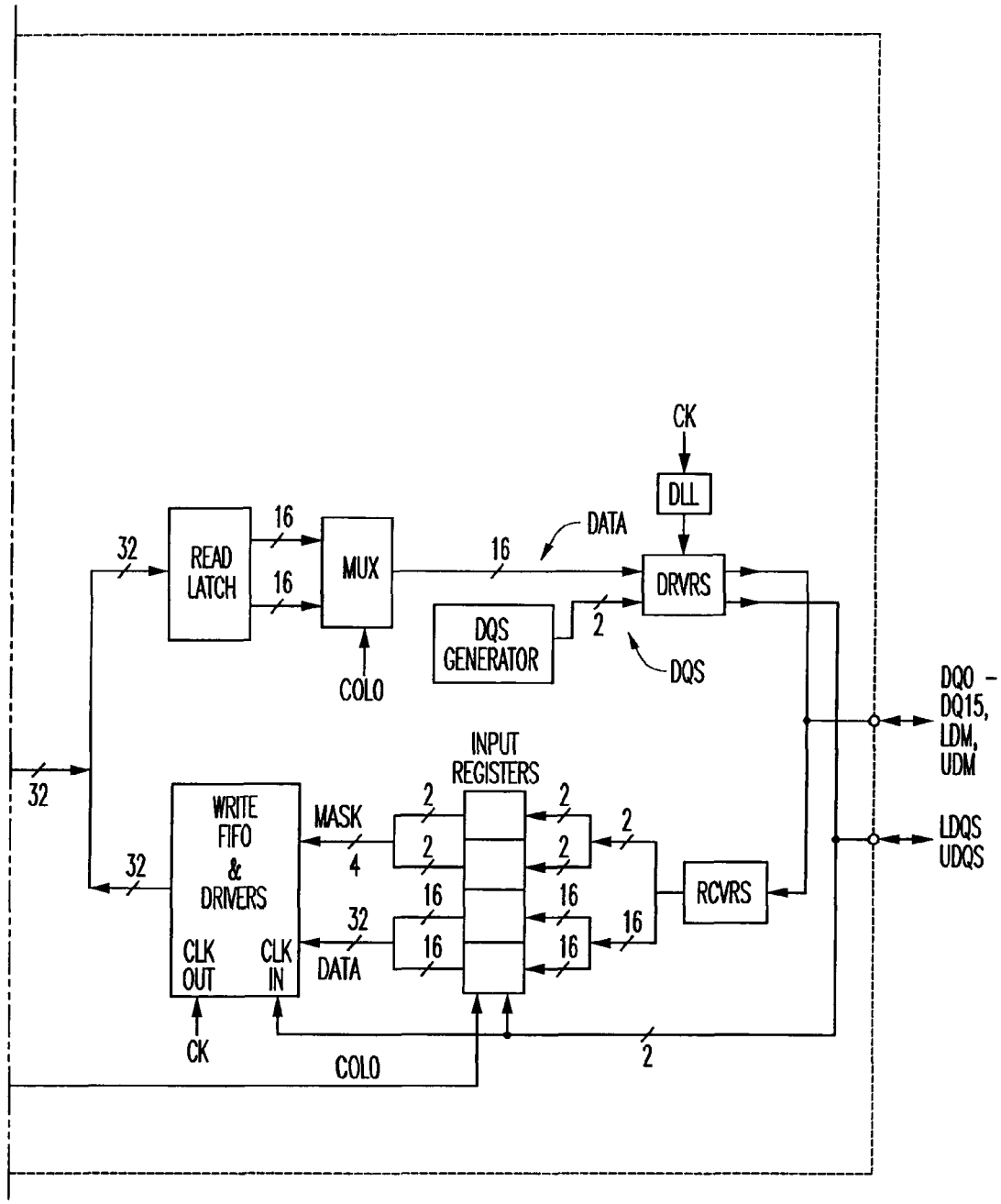
Figure 4:
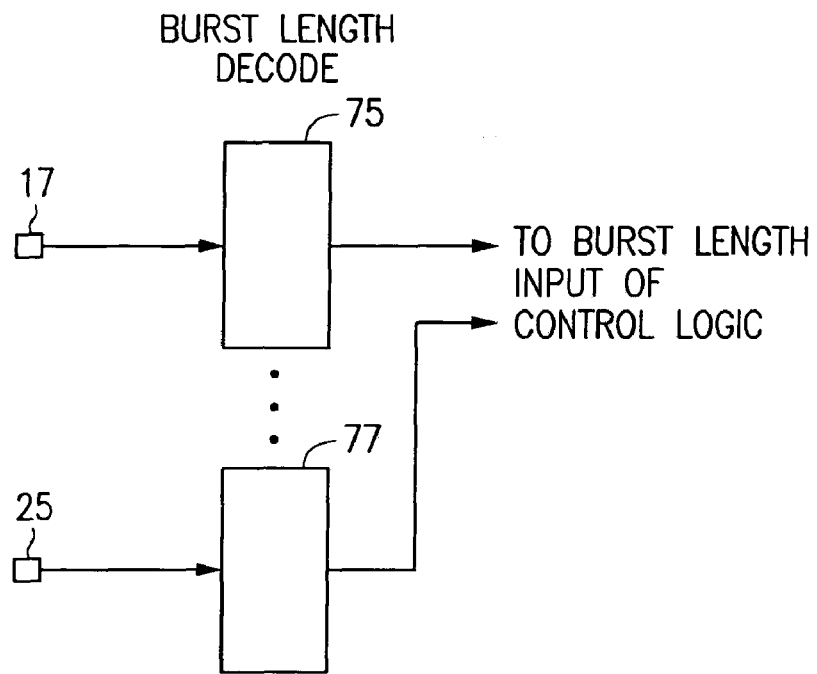
FIG. 4 is an illustration of a burst length latch in a preferred embodiment of the present invention.

FIG. 3 is a block diagram of the FIG. 2 256M×16 DDR SDRAM. Control logic 310, as shown in FIG. 3, receives a data signal on the burst length input pin (e.g. external pin 17) as an input. One or more external pins can be used to input burst length data. A command decode circuit 312, which is part of the memory device control logic 310, determines what the burst length is based on the data signals applied to the external burst control pin(s). For example, if the external burst pin is a single pin 17 (i.e. for 2 possible burst lengths), the command decode determines if the voltage on pin 17 is set to Vcc indicating a first burst length or Vss indicating a second burst length. The status of the one or more burst length pins sets appropriate internal burst codes (FIG. 4, decode circuits 75, 77) within the command and decode circuit 312.

Implementation of the present invention requires very little internal change to existing memory devices. Thus, where the burst length would previously be output from mode register 100 (FIG. 1) to other circuits within control logic 310 (FIG. 2) to set burst length, in the present invention, it is output to the other circuits from one or more decode circuits or data latches 75, 77 (FIG. 4) within command decode circuit 312 which now contains this data. In both the conventional memory device of FIG. 2 and one in accordance with the present invention, the burst length data is used by the control logic 310 to set burst length. Accordingly, nothing outside of the control logic 310 needs to be changed to implement the present invention, and very little change within control logic 310 is required.

By using external control pins to control the burst length instead of the mode register 100, the burst length can be controlled dynamically from the exterior of the memory device 100. The burst length also can be changed simultaneously with a READ or WRITE command.

In addition to using the external control pins to determine the burst length, the burst type can also be set using external control pins. This allows the burst type to also be set dynamically. As with using the external control pins to adjust burst length, using the external control pins to determine the burst type can be easily incorporated into most existing memory storage device designs by using another one of the NC pins. For example, referring to FIG. 2, external pin 53 could be used to determine burst type of the memory device 200. If burst type pin 53 is e.g. high, the burst type is interleaved; if burst type pin 53 is e.g. low, the burst type is sequential.

The same type of modifications necessary to change control of the burst length from mode register 100 to the external pin 17 are necessary to change control of the burst type from mode register 100 to external pin 53. Thus, a decode circuit 79 (FIG. 5) within the column decode and burst counter circuit 312 receives a data signal applied to external pin 53 and the output of this circuit 79 goes to the same circuitry within the control logic 312 which processes burst type data previously set in the mode register 100. Thus, controlling burst type with an external control pin only requires a small internal change within control logic 310.

Another exemplary embodiment of the present invention uses the address pins to set burst length and/or burst type. As shown in FIG. 3, thirteen external pins (e.g. A0-A12) are input into address register 320 for addressing. Both row and column addresses use the same 13 pins. During column addressing, however, only 10 (A0, . . . , A9) of the 13 pins are needed. The remaining three pins (A10 . . . A12) can be used to determine burst length and/or burst type.

Figure 5:
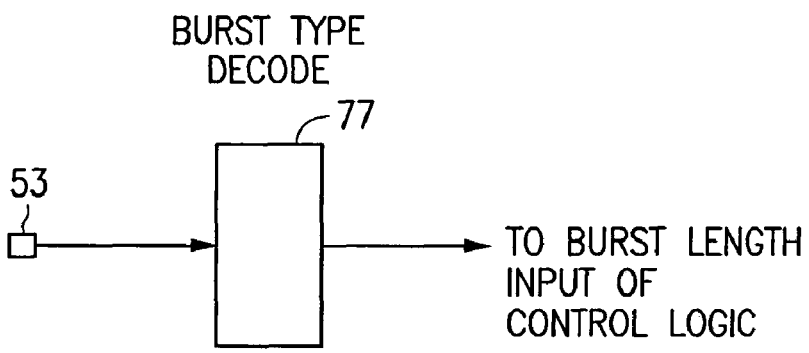
FIG. 5 is an illustration of a burst type latch in a preferred embodiment of the present invention.
Figure 6:
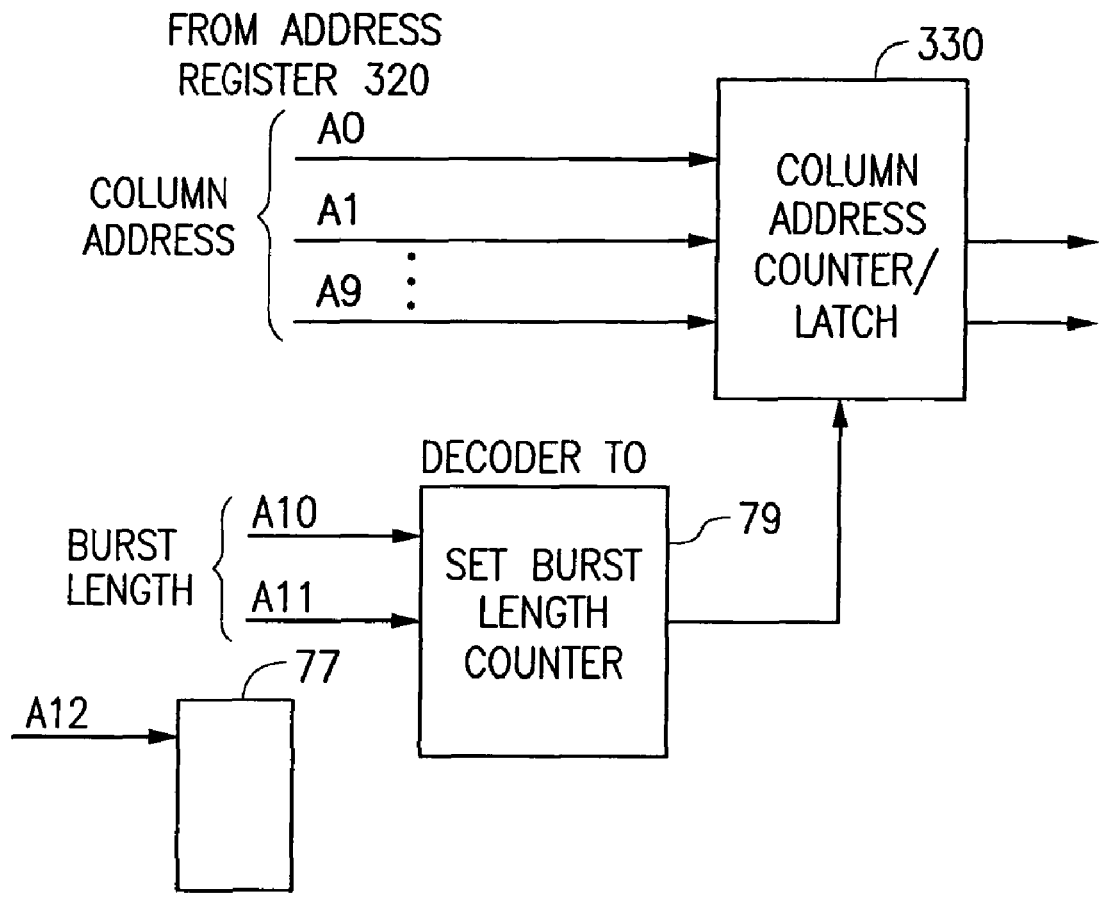
FIG. 6 is an illustration of a column address counter/latch in an exemplary embodiment of the present invention.

In this embodiment burst length data is applied to one or more of address pins A10 . . . A12. FIG. 6 shows two such address lines (A10, A11) being used for this purpose. A decode circuit 81 decodes this data and supplies the burst length information to the column address counter/latch 330 (FIG. 3). If less than all of the unused address lines are required for setting burst length, any remaining lines, e.g. A12 in FIG. 6, can be used to set burst type decode circuit 77 (FIG. 5).

It should be noted that although FIG. 6 shows a decoder 81 for the burst length signal(s) which is external to the column address counter/latch 330, decoder 81 may also be incorporated within the column address counter/latch 330.

The mode register for a memory device implementing embodiments of the present invention does not require the bit positions A0-A2 illustrated in mode register 100 for setting burst length and/or bit position A3 for setting burst type and can therefore be made shorter in length, or the unused bit positions may be used for other functions.

The invention may be used in many types of memory devices in addition to the DDR SDRAM memory device illustrated in FIGS. 2 and 3.

Figure 7:
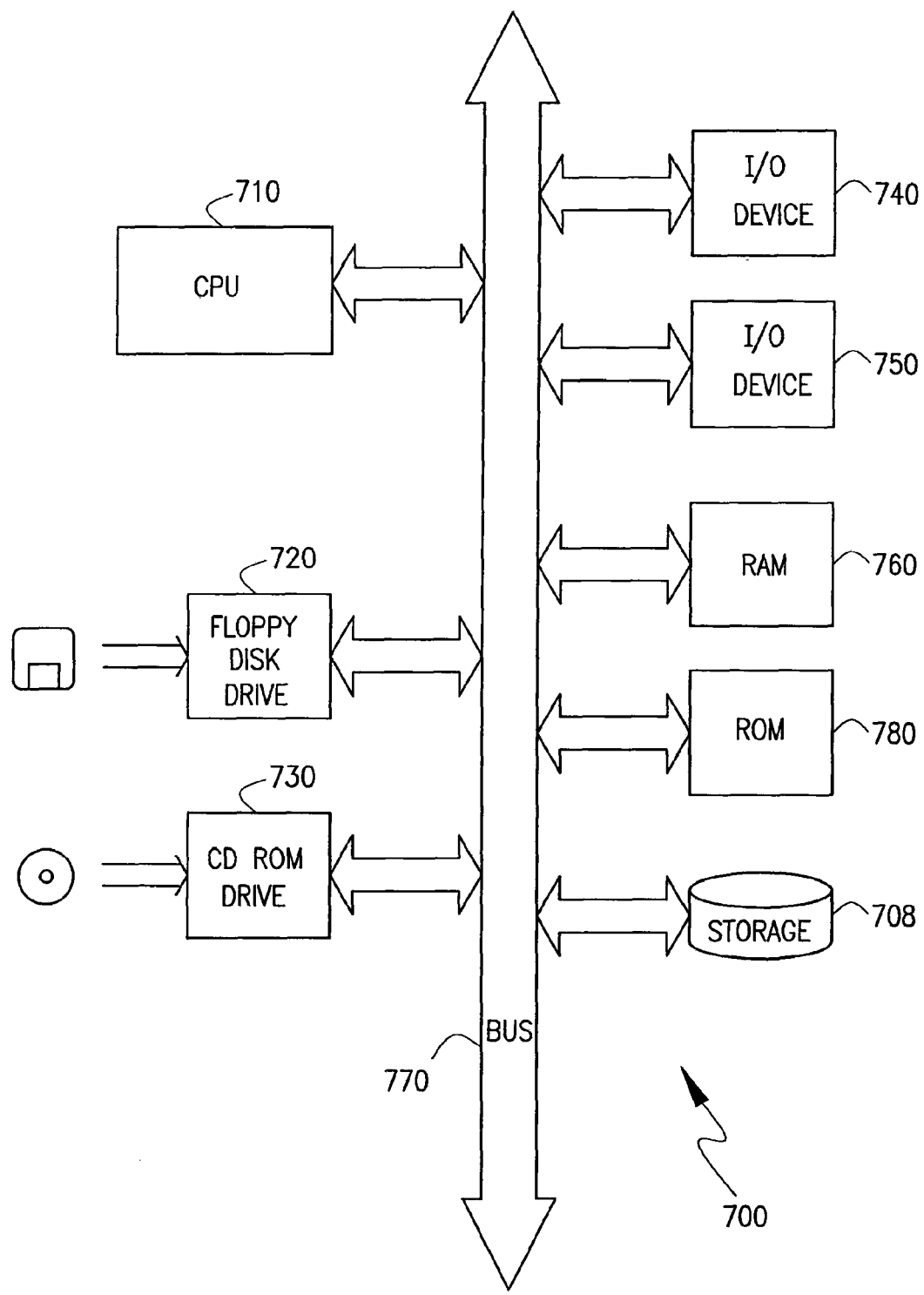
FIG. 7 illustrates a processor system which includes electronic devices containing the invention.

FIG. 7 shows a processor system, such as, for example, a computer system in which the invention may be used. The processor system generally comprises a central processing unit (CPU) 710, for example, a microprocessor, that communicates with one or more input/output (I/O) devices 740, 750 over a bus 770. The system 700 also includes random access memory (RAM) 760, a read only memory (ROM) 780 and, in the case of a computer system may include a permanent data storage device 708 and peripheral devices such as a floppy disk drive 720 and a compact disk (CD) ROM drive 730 which also communicate with CPU 710 over the bus 770. The random access memory (RAM) 760 may incorporate external pin control of burst length and/or burst type in accordance with the invention. In addition, one or more of memory devices 760, 780 may be fabricated as an integral part with CPU 710. While FIG. 7 represents one processor system architecture, many others are also possible.

While the invention has been described with reference to an exemplary embodiments various additions, deletions, substitutions, or other modifications may be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method comprising:
   receiving a read or write command request on a double data rate memory device having separate groups of external pins adapted to receive address, data, and control information; and
   setting a burst type of the double data rate memory device to one of sequential or interleaved according to a signal input to an address pin of the double data rate memory device proximate in time to receipt of the read or write command.

2. The method of claim 1, wherein the burst type is set with receipt of a read command.

3. The method of claim 1, wherein the burst type is set with receipt of a write command.

4. The method of claim 1, wherein the address pin at which the burst type is set is connected to control logic of the double data rate memory device and column access circuitry, such that burst type is set with a column addressing portion of the read command.

5. The method of claim 1, wherein the address pin is A3.

6. A method comprising:
   setting a burst type of a double data rate memory device by applying a signal to a single one of a plurality of external pins of the double data rate memory device, the plurality of external pins being grouped for address, control and data input;
   processing a read command on the double data rate memory device according to the burst type set at a single external pin of the double data rate memory device; and
   outputting interleaved or sequentially output data from the double data rate memory device depending on the burst type set.

7. The method of claim 6, wherein if a logic value applied to the external pin is high, the burst type is set to interleaved, and if the logic value applied to the external pin is low, the burst type is set to sequential.

8. The method of claim 6, wherein the external pin at which burst type is set is an address pin.

9. The method of claim 8, wherein the address pin is A3.

10. A double data rate memory device comprising:
    separate external pin connections assigned for address, control and data input; and
    a control logic circuit for controlling operations of the double data rate memory device, the control logic circuit being responsive to a signal received at one of the external pin connections of the double data rate memory device to set a burst type on the double data rate memory device, wherein depending on the signals input to the single external address pin, the burst type is set to interleaved or sequential.

11. The double data rate memory device of claim 10, wherein the burst type is set with receipt of a read command.

12. The double data rate memory device of claim 10, wherein the burst type is set proximate in time to a column addressing operation.

13. The double data rate memory device of claim 10, wherein the single external pin at which burst type is set is an address pin.

14. The double data rate memory device of claim 13, wherein the single address pin is A3.

15. The double data rate memory device of claim 10, wherein if the signal at the single external pin is high, the burst type is set to interleaved, and if the signal at the single external pin is low, the burst type is set to sequential.

16. A system, comprising:
    a double data rate memory device having separate groups of external pins adapted to receive addressing, data, and control information; and
    a memory controller adapted to set a burst type of the double data rate memory to interleaved or sequential by sending a signal through one of the external pins of the double data rate memory device, such that when a read command is sent by the controller, depending on the burst type set, the double data rate memory device returns interleaved or sequentially output data to the memory controller.

17. The system of claim 16, wherein the burst type is set proximate to when a read command is received at the double data rate memory device.

18. The system of claim 16, wherein the external pin to which the burst type setting signal is sent by the memory controller is an address pin.

19. The system of claim 18, wherein the address pin is A3.

20. The system of claim 16, wherein if a logic value corresponding to the signal sent to the external pin is high, the burst type is set to interleaved, and if the logic value corresponding to the signal sent to the external pin is low, the burst type is set to sequential.

* * * * *